United States Patent
Pascucci et al.

[11] Patent Number: 5,815,437
[45] Date of Patent: Sep. 29, 1998

[54] DATA INPUT/OUTPUT MANAGING DEVICE, PARTICULARLY FOR A NON-VOLATILE MEMORY

[75] Inventors: Luigi Pascucci, Sesto San Giovanni; Antonio Barcella, Trescore Balneario; Paolo Rolandi, Voghera; Marco Fontana, Milan, all of Italy

[73] Assignee: SGS-Thomson Microelectronics S.r.l., Agrate Brianza, Italy

[21] Appl. No.: 813,171

[22] Filed: Mar. 7, 1997

[30] Foreign Application Priority Data

Mar. 20, 1996 [EP] European Pat. Off. .............. 96830127

[51] Int. Cl.[6] .............................. G11C 11/34; G11C 7/00
[52] U.S. Cl. ............................. 365/189.05; 365/185.09; 365/189.05; 365/200
[58] Field of Search .................. 365/185.05, 185.09, 365/189.05, 200

[56] References Cited

U.S. PATENT DOCUMENTS 4,426,688  1/1984  Moxley .................................. 365/200

FOREIGN PATENT DOCUMENTS

A-0 313 040  4/1989  European Pat. Off. ........ G11C 29/00

OTHER PUBLICATIONS

European Search Report fron European Patent Application 98603127.5, filed Mar. 20, 1996.

IEEE Journal of Solid–State Circuits, vol. 27, No. 11, Nov. 1, 1992, pp. 1525–1531, Akira Tanabe, et al., "A 30–NS 64–MB Dram With Built–In Self–Test and Self–Repair Function".

*Primary Examiner*—David C. Nelms
*Assistant Examiner*—Trong Phan
*Attorney, Agent, or Firm*—Wolf, Greenfield & Sacks, P.C.

[57] ABSTRACT

A data input/output managing device, particularly for non-volatile memories that comprise at least one matrix of memory cells. The managing device comprises: at least one bidirectional internal bus for the transfer of data from and to the memory; a redundancy management line that is associated with the internal bus; means for enabling/disabling the transmission, over the internal bus, of the data from the memory toward the outside; means for enabling/disabling access to the internal bus on the part of data whose source is other than the memory matrix, for transmission to the memory matrix; and means for enabling/disabling the connection between the outside of the memory and the redundancy line during the reading of the memory matrix and during its programming.

36 Claims, 2 Drawing Sheets

DATA INPUT/OUTPUT MANAGING DEVICE, PARTICULARLY FOR A NON-VOLATILE MEMORY

BACKGROUND OF THE INVENTION

1. Field of the Invention

The present invention relates to a data input/output managing device, particularly for a non-volatile memory.

2. Discussion of the Related Art

It is known that in a non-volatile memory data can be written to the memory and read from the memory. The writing of data to the memory may also be referred to as programming the memory.

The steps of reading from and writing to the memory are usually performed by using data transfer paths that are unidirectional and are therefore strictly dedicated to one step or the other.

This separation of the reading and programming paths entails the use of several specifically provided lines that branch from output terminals of the memory toward the memory and from the memory toward the output terminals.

In order to perform transfers of data whose source or destination is not the memory matrix, it is necessary to implement data transmission lines in addition to the existing programming and reading lines.

The need for these additional lines arises for example in implementing a redundancy function, by virtue of which a column (or line) of the memory matrix that is found to be defective is replaced, i.e., made redundant, by means of an appropriate alternative line, on which the data item that would have otherwise been sent to or from the defective line is sent. In this manner it is possible to obviate the presence of lines having defective memory cells that would prevent correct storage of data and its subsequent retrieval.

The above-mentioned additional lines require considerable additional space. If a memory architecture in which the output terminals are adjacent to or near the memory circuits is used, then these additional lines have a rather limited length, although even so they still occupy a considerable area.

If instead, the memory matrix has bit lines that are not connected in an adjacent manner, but in a manner that is distributed along a transverse extension of the memory, which is advantageously organized into two half-matrices, duplication of the input and output paths toward and from the memory matrix that has thus been split in two entails the drawback of doubling the area occupied by the lines as well as resulting in an extremely complicated architecture for said memory.

Indeed, in the case of a split 16-bit memory matrix, i.e., with words formed by 16 bits, with transmission structures that are arranged transversely with respect to the arrangement of the terminals, sixteen output terminals are required. Two lines, one for reading the data of the matrix and one for programming it, branch out of each output terminal; furthermore, a line dedicated to redundancy management branches out of each terminal.

Moreover, a line dedicated to DMA (Direct Memory Access), i.e., to provide direct access to the memory matrix by the outside world, for checking the correct operation of each individual cell, branches out of each output terminal.

Therefore, on the whole, there are four transmission lines for each terminal, and this obviously entails a highly complex memory architecture.

SUMMARY OF THE INVENTION

The aim of the present invention is therefore to provide a data input/output managing device, particularly for a non-volatile memory, that improves the organization of paths for the transmission of data to and from the memory matrix.

Within the scope of this aim, an object of the present invention is to provide a data input/output managing device, particularly for a non-volatile memory, that reduces the data transmission lines required for the memory, concentrating their information on "single points", thus simplifying their architecture.

Another object of the present invention is to provide a data input/output managing device, particularly for non-volatile memories, that sets the number of input parallel bits to either 8 or 16 of the memory.

Another object of the present invention is to provide a data input/output managing device, particularly for non-volatile memories, that is capable of managing redundancy for the memory.

Another object of the present invention is to provide a data input/output managing device, particularly for non-volatile memories, that provides direct memory access.

Another object of the present invention is to provide a data input/output managing device, particularly for non-volatile memories, that is highly reliable and relatively easy to produce at competitive costs.

One embodiment of the present invention is directed to a data input/output managing device for non-volatile memories that comprises at least one matrix of memory cells. The data input/output managing device includes at least one bidirectional internal bus for the transfer of data from and to the memory, a redundancy management line that is associated with the internal bus, means for enabling and disabling transmission, over said internal bus, of data from the memory matrix, means for enabling and disabling transmission, over said internal bus, of data to the memory matrix, and means for enabling and disabling a connection to the redundancy line during a reading of the memory matrix and during its programming.

Another embodiment of the present invention is directed to a data input/output managing apparatus for managing input data to be written to a memory and for managing output data to be read from the memory. The apparatus includes an input/output port that receives data to be written to the memory and provides data read from the memory, a data bus that receives data read from the memory and transmits data to the memory, the data bus having a node to receive data and to provide data, a first data path to transmit data read from the memory between the data bus and the input/output port, a second data path to transmit data to be written to the memory between the input/output port and the data bus, and a first switch, having an input to receive a first control signal, that couples the first data path between the node of the data bus and the input/output port in response to a first state of the first control signal, and in response to a second state of the first control signal, couples the second data path between the node and the input/output port.

Another embodiment of the present invention is directed to a method for managing input data to be written to a memory and for managing output data to be read from the memory. The method includes steps of establishing a first data path between the memory and an input/output port for transmitting data read from the memory to the input/output port, establishing a second data path between the memory and the input/output port for transmitting data to be written to the memory, receiving a first control signal having a first state and a second state, in response to the first state of the control signal, enabling the first data path, and in response to the second state of the first control signal, enabling the second data path.

Another embodiment of the present invention is directed to a data input/output managing apparatus for managing input data to be written to a memory and for managing output data to be read from the memory. The apparatus includes an input/output port that receives data to be written to the memory and provides data read from the memory, a data bus that receives data read from the memory and transmits data to the memory, the data bus having a node to receive data and to provide data, a first data path to transmit data read from the memory between the data bus and the input/output port, a second data path that transmits data to be written to the memory between the input/output port and the data bus, means for coupling the first data path between the input/output port and the node of the data bus to establish a first mode of operation of the data input/output managing device, and means for coupling the second data path between the input/output port and the node of the data bus to establish a second mode of operation of the data input/output managing device.

DETAILED DESCRIPTION

Figure 1:
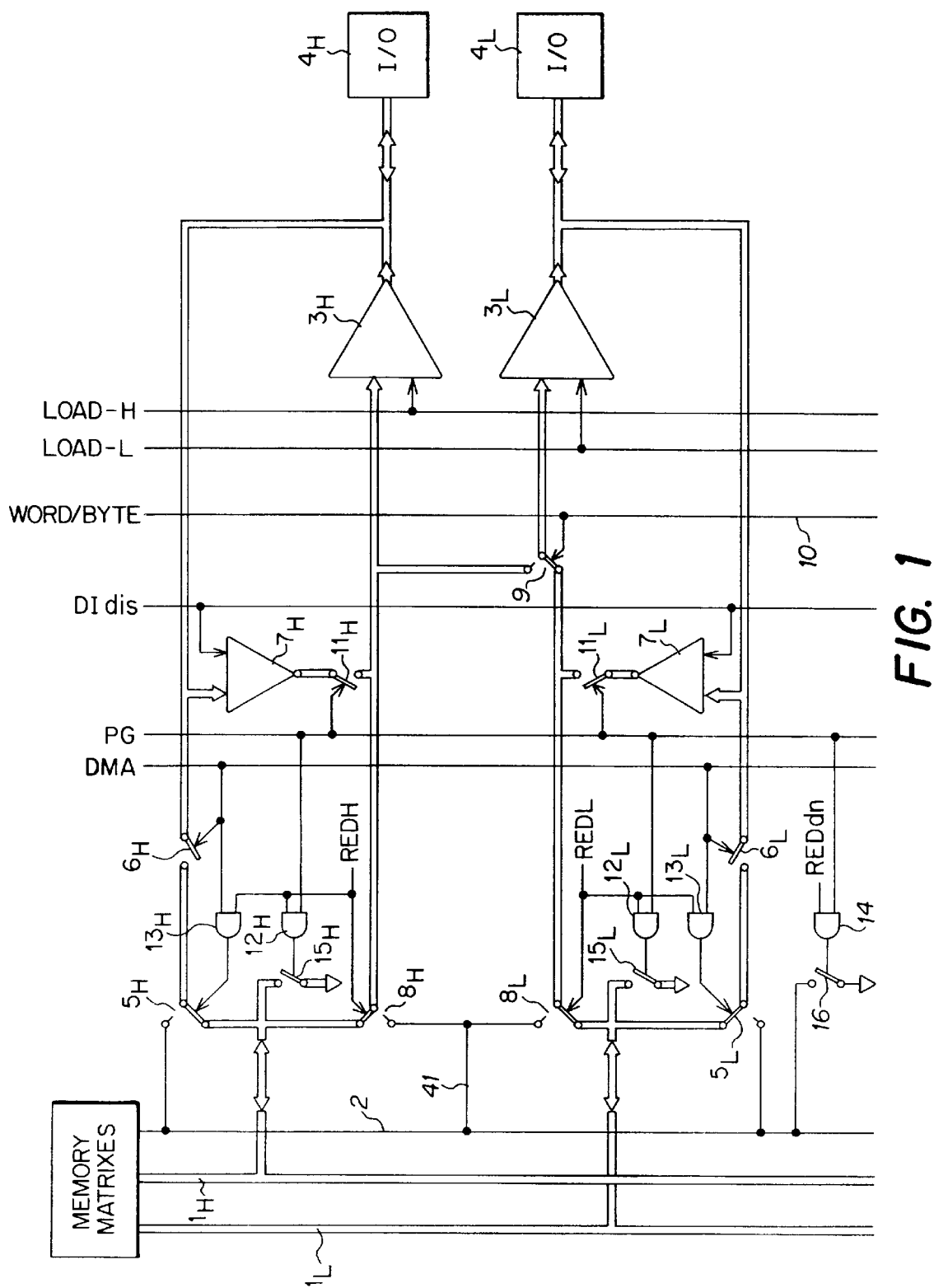
FIG. 1 is a block diagram of the data input/output managing device according to the invention.

With reference to the above figures, the device according to the invention comprises a bidirectional internal data bus, split into two buses $1_L$ and $1_H$, where the suffixes L and H relate respectively to the half-word referenced as L and to the half-word referenced as H.

The internal bus 1 (where 1 references hereinafter the set constituted by the two buses $1_L$ and $1_H$) is dedicated to the transfer of the data to and from the memory matrix, which is not shown in the figures.

A data line 2 for the transmission of redundancy data is associated with the internal bus 1.

The bus $1_L$ is connected to corresponding output buffers $3_L$ and from there to output terminals $4_L$.

The output buffers $3_L$ also comprise structures of the tristate type that notoriously interface with the outside.

The output terminals $4_L$ are data input/output (I/O) terminal, that are adapted to allow the output of data from the memory (during reading) and the input of data into the memory (during programming).

In view of the symmetry of the architecture of the device for the internal bus $1_L$ and $1_H$, hereinafter, to avoid redundancy in the description, the architecture of the device according to the invention will be described hereinafter with reference to the portion of the device that is referenced as L. Every remark made regarding this part should be understood as being applicable to the symmetrical part H.

The output terminals $4_L$ and the output buffers $3_L$ are actually eight output terminals and eight output buffers, since the memory device being considered is of the 16-bit type, i.e., with words (bytes) that are 16 bits long; therefore, there is an output buffer and an output terminal for each bit.

Likewise, the internal bus $1_L$ is constituted by eight lines (eight lines for the internal bus $1_H$ as well).

The connecting paths between the internal bus $1_L$, the output buffer $3_L$, and the output terminal $4_L$ (these paths are always buses) are as follows.

There is a path for direct connection between the internal bus $1_L$ and the output terminal $4_L$ that is managed by a device for enabling/disabling the direct connection between the internal bus $1_L$ and the output terminals $4_L$. The device for enabling/disabling includes switches $5_L$ and $6_L$. Said path is bidirectional and branches in input to a programming enabling device $7_L$ that is adapted to program the memory device, and thus to send data on the internal bus $1_L$ in the opposite direction with respect to the normal stream of data provided for reading. The programming enabling device $7_L$ actually includes eight programming enabling devices, as in the case of the output buffers $3_L$ and of the output terminals $4_L$.

The programming enabling device $7_L$ comprises bidirectional components, such as for example pairs of CMOS pass transistors.

The path for direct connection between the internal bus $1_L$ L and the output buffer $3_L$ is also managed by means for enabling/disabling direct connection of the data from the internal bus $1_L$ to the buffer $3_L$. Said enabling/disabling means are advantageously constituted by a switch $8_L$. In the position shown in FIG. 1, the switch $8_L$ enables the connecting path between the internal bus $1_L$ and the output buffer $3_L$ to read data from the memory.

Means for setting the input of the memory to either 16 or 8 parallel bits are advantageously constituted by an additional switch 9 (in this case, the switch 9 is shared by the two portions L and H of the device), which sets the input to either 16 or 8 parallel bits in response to an input signal on a line 10 that is dedicated to parallelism management. Hereinafter, said line is referenced as WORD/BYTE line.

In the position shown in FIG. 1 for the switch 9, 16 bit parallelism management is enabled, whereas management of 8 bit parallelism of the memory would be enabled in the other position of the switch.

The output of the programming device $7_L$ is constituted by data to be written to the memory and is sent to the path for connection to the internal bus $1_L$ by virtue of means for enabling/disabling access on the part of the outside world to the internal bus $1_L$ and therefore to the memory. Said means are advantageously constituted by a switch $1\,1_L$ that has an input to receive a programming signal that is carried by the line PG.

The output buffer $3_L$ has an input to receive a signal for enabling said buffer, which is carried by a line referenced as LOAD-L.

Likewise, the output buffer $3_H$ has an input to receive an enabling signal that is carried by a line LOAD-H.

A direct memory access signal, carried by a line DMA, drives the switch $6_L$ and redundancy structures that will be described hereinafter.

A signal for disabling the programming device $7_L$, carried by a line DIdis, is coupled to an input of said programming means $7_L$.

Column redundancy management means are constituted by logic means that comprise AND logic gates $12_L$, $13_L$ and 14.

In detail, the AND logic gate $12_L$ has a first input that receives a column redundancy signal for the half-matrix L, REDL, which also drives the switch $8_L$, and logic gate $12_L$ has a second input that receives the signal PG. The output of the AND gate $12_L$ drives a switch $15_L$ that is adapted to carry the data on the redundancy line 2 if a redundancy event occurs.

The AND logic gate $13_L$ receives the signal DMA and the signal REDL and has an output that drives the opening or closing of switch $5_L$.

The AND logic gate 14 receives a no-redundancy signal REDdn (which is high in case of no redundancy and low otherwise) and the programming signal PG to drive a switch 16 that is adapted to connect the redundancy line 2 to ground, in case of no redundancy, or to remain open in case of redundancy exclusively during programming.

Figure 2:
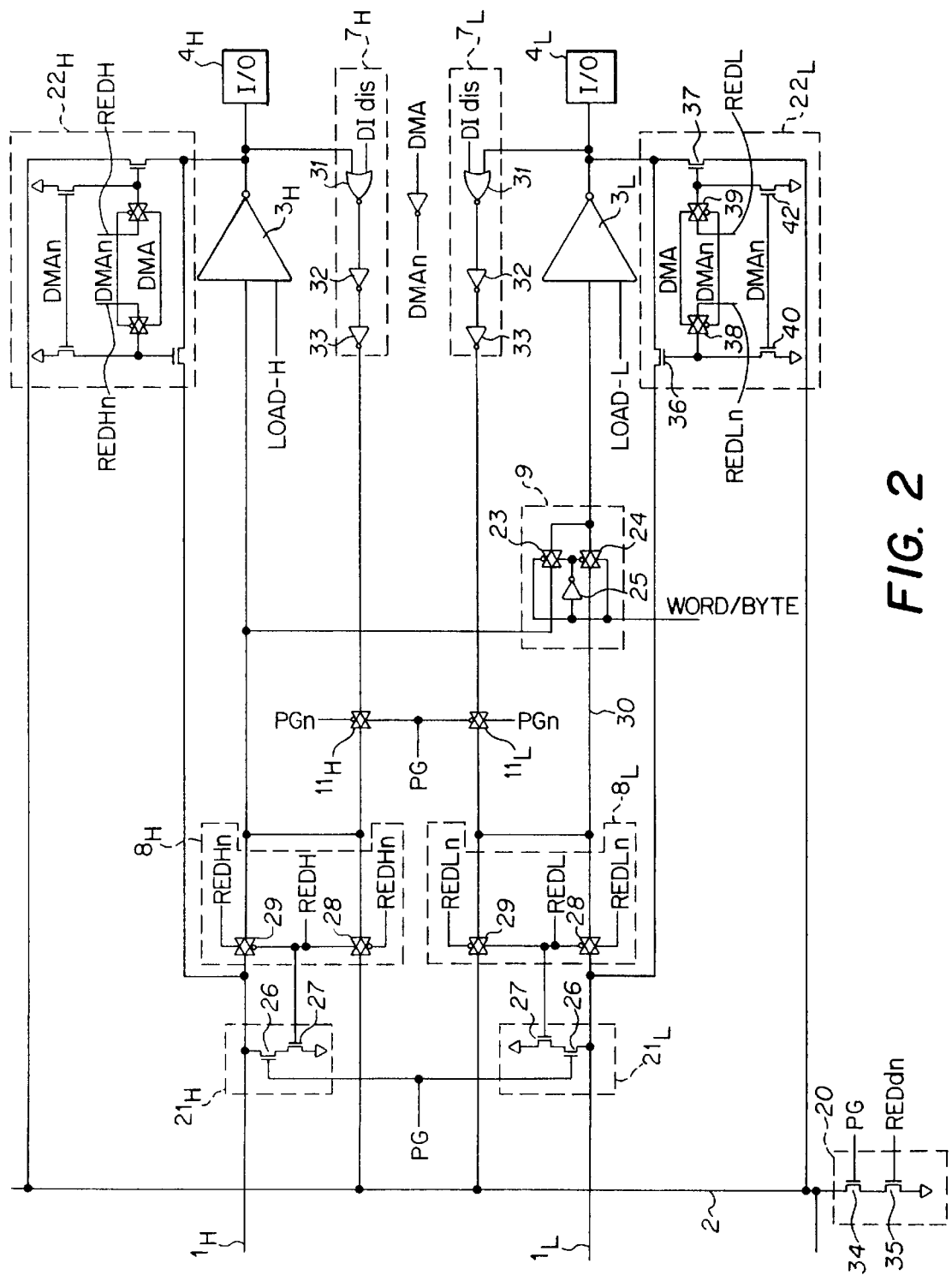
FIG. 2 is a circuit diagram of the input/output managing device shown in FIG. 1.

With reference to FIG. 2, which shows in detail the circuits of the architecture of the input/output managing device shown in FIG. 1, the individual elements of the above-described architecture are analyzed from the circuital point of view. In the two figures, identical reference numerals designate identical elements.

As in the case of FIG. 1, only the lower portion of the circuit, which corresponds to the half-word L, is described; any remark made for this half-word must be understood as being valid for the circuital part related to the other half-word H as well. The individual elements that constitute the circuits of the portion of the half-word H and of the half-word L are designated by the same reference numerals, for the sake of simplicity, without the suffixes H or L.

The switch 9 for setting the memory to 8 or 16 bits includes two pairs of CMOS pass transistors 23 and 24, each of which comprises a P-type transistor and an N-type transistor. The signal WORD/BYTE is sent to the gate terminal of the P-type transistor of the pair of pass transistors 23 and to the gate terminal of the N-type transistor of the pair of pass transistors 24.

The signal WORD/BYTE, inverted by means of the inverter 25, is fed to the gate terminals of the N-type transistor of the pair of pass transistors 23 and of the P-type transistor of the pair of pass transistors 24. The signal WORD/BYTE performs the byte/word data configuration function.

The pairs of pass transistors 23 and 24 are furthermore connected to the output buffers $3_H$ and $3_L$ respectively.

The circuit referenced by $21_L$ corresponds to the switch $15_L$ and to the AND logic gate $12_L$. Said circuit comprises two N-type transistors 26 and 27 that are connected as shown in the figure. The programming signal PG is sent to the gate terminal of the transistor 26. Said signal performs the function of forcing the wire $1_L$ to zero in case of redundancy during programming.

The source terminal of transistor 26 is connected to the line $1_L$, whereas the drain terminal of transistor 27 is connected to ground.

The gate terminal of transistor 27 is instead connected to the gate terminals of pairs of pass transistors 28 and 29 that belong to the block designated by the reference numeral $8_L$. Said circuit block corresponds to the switch $8_L$.

The pairs of pass transistors 28 and 29 are constituted respectively by two transistors, respectively of the P type and of the N type. The signal REDLn (the inverted redundancy signal) is sent to the gate terminal of the N-type transistor of the pair of pass transistors 28 and to the gate terminal of the P-type transistor of the pair of pass transistors 29.

The pairs of pass transistors 28 and 29 are connected respectively to the line $1_L$ and to the line that connects the redundancy line 2 and the programming device $7_L$. Said connecting line is in turn connected, by means of the wire 30, to the line $1_L$. The wire 30 performs the function of rerouting the data path in case of redundancy both during programming and during reading (but not during DMA).

The switch $11_L$, adapted to enable the closure of the programming path toward the line $1_L$ (or the line 2 upon redundancy), comprises a pair of pass transistors $11_L$ that is constituted by an N-type transistor and by a P-type transistor.

The programming signal PG is sent to the gate terminal of the N-type transistor, whereas the inverted programming signal PGn is sent to the gate terminal of the P-type transistor of the pair of pass transistors $11_L$.

The programming device $7_L$ comprise a logic gate 31, whose output is sent through two cascade-connected inverters 32 and 33 to the redundancy line 2 or to the line $1_L$ over the wire 30, depending on the conditions.

The inputs of the logic gate 31, which is advantageously constituted by a NOR gate, are the signal DIdis for disabling the programming device and the signal that arrives from the input/output means $4_L$ that carries the data to be programmed.

The switch 16 and the logic gate 14 of FIG. 1 are generally shown in the circuit 20 of FIG. 2, which comprises two N-type transistors 34 and 35. The drain terminal of transistor 34 is connected to the redundancy line and the source terminal of transistor 34 is connected to the drain terminal of transistor 35. The source terminal of transistor 35 is connected to ground. The object of circuit 20 is to force the redundancy line 2 to ground when there is no redundancy during programming.

The programming signal PG is sent to the gate terminal of transistor 34, whereas the no-redundancy signal REDdn is sent to the gate terminal of transistor 35.

The switch $5_L$, the logic gate $13_L$, and the switch $6_L$ are generally shown by the circuit $22_L$ of FIG. 2.

Circuit $22_L$ comprises two transistors 36 and 37 of the N type that are adapted to enable the path for direct access to the memory (therefore with the switch $6_L$ closed and with the switch $5_L$ in the position shown in FIG. 1) or to enable the path for direct access to the redundancy line 2 if the data item to be read is subjected to redundancy.

The circuit $22_L$ also comprises two pairs of pass transistors 38 and 39, each of which is constituted by two transistors, one of the N type and one of the P type.

The inverted DMA signal (DMAn) for direct memory access is sent to the gate terminals of the two P-type transistors of the pairs of pass transistors 38 and 39. The signal DMA for direct memory access is sent to the gate terminals of the two N-type transistors of the pairs of pass transistors 38 and 39.

The circuit $22_L$ also includes two additional N-type transistors 40 and 42, whose gate terminals receive the inverted direct memory access signal DMAn. The source terminals of said transistors are connected to ground.

The drain terminal of transistor 40 is connected to the gate terminal of transistor 36, whereas the drain terminal of transistor 42 is connected to the gate terminal of transistor 37.

The inverted redundancy signal REDLn is sent to pass transistor 38 and the redundancy signal REDL is sent to pass transistor 39.

With reference to the above figures, the operation of the device according to the invention is as follows.

The device according to the invention, in the configuration shown in FIG. 1, is in the condition for normal reading from the memory matrix in the word mode. The path followed by the data of the matrix lies along the internal bus 1 up to the I/O means $4_i$ (where i=L,H). For the sake of simplicity in description, only operation as regards the memory half-word L is described.

In this situation for the normal reading of the memory matrix, the switches $8_L$ and 9 are in the condition shown in FIG. 1.

The redundancy path, the programming path, and x8 parallelism management are disabled.

In the absence of redundancy and programming, the no-redundancy signal REDdn is high and the programming signal is low; therefore, the switch 16 is open and the redundancy line is not connected to the ground and is thus left free.

If the programming signal goes high, indicating a programming request, it is necessary to enable the reverse path for the data (with respect to reading from the memory matrix), i.e., from the I/O means $4_L$ to the internal bus $1_L$ and then to the matrix.

When PG is high, and in the absence of redundancy (REDL=0, REDLn=1, and REDdn=0), both P-type and N-type transistors of the pair of pass transistors $11_L$ constitute short circuits: therefore, the switch designated again by $11_L$ in FIG. 1 is closed, allowing the data to pass from the programming device $7_L$ to the internal bus $1_L$.

In this case, the switch $8_L$ is in the position shown in FIG. 1, since we are dealing with the case of programming in the absence of redundancy.

When PG is high and in the absence of redundancy, the switch 16 is closed and the redundancy line 2 is forced to the ground, in order to avoid accidental programming of the redundancy lines.

If direct memory access now occurs, i.e., when DMA is high, transistor 36 behaves like a short circuit, whereas the transistor 37 behaves like an open circuit (therefore the switch $6_L$ is closed) and the data are routed by the I/O means directly to the internal bus $1_L$, bypassing the output buffers $3_L$.

It is now necessary to consider the following cases: request for reading from the memory in the presence of redundancy, request for programming in the presence of redundancy, and request for direct memory access again in the presence of redundancy.

We will first consider reading from the memory in the presence of redundancy. In this case, therefore, the signal REDL is high, the signal DMA is low, and the programming signal PG is low.

The switches $5_L$ and $6_L$ are not affected, since DMA=0.

The switch $8_L$, in case of redundancy, assumes the position for connection to the connector 41 that leads to the redundancy line 2. If REDL is high, the two pass transistors 28 form an open circuit and the signal is routed through the two pass transistors 29 and from there over the wire 20, in order to be sent to the output buffers $4_L$.

In case of programming with redundancy, and therefore if the signal PG is high and the signal REDL is high, the switch $15_L$ closes, selectively connecting to ground one line of the internal bus $1_L$, specifically the line that should be programmed but is made redundant. In turn, the switch $8_L$ moves to the position for connection to the wire 41 and thus to the redundancy line 2; i.e., the two pass transistors 28 behave like an open circuit, whereas the two pass transistors 29 behave like a short circuit, enabling the transfer of the programming data on the redundancy line 2. In this case, switch 16 remains open.

Consider now the case of a request for direct memory access in the presence of redundancy, therefore when DMA and REDL are both high.

In this situation, it is necessary to perform a direct memory access but by accessing the line thereof that has been made redundant instead of the natural line. This occurs only for the line that has been made redundant and not for all the other ones.

Therefore, when REDL is high, switch $8_L$, which corresponds to the line that has been made redundant, assumes the position for connection to the redundancy line, as already described earlier; when REDL is high, the switch $6_L$ closes, enabling the direct connection to the I/O means $4_L$, and the switch $5_L$ assumes the position for connection to the redundancy line 2.

The switches $15_L$ and 16 remain open because they are meant for programming activity and are therefore controlled by this activity.

As regards instead the control of 16 bit (word) or 8 bit (byte) parallelism, when the signal on the line WORD/BYTE is high, indicating 16 bit parallelism, the pair of pass transistors 23 behaves like an open circuit and the pass transistor 24 behaves like a short circuit; therefore, the switch 9 of FIG. 1 is in the condition shown in FIG. 1; otherwise, when the signal on the line WORD/BYTE is low, it is the pair of pass transistors 24 that behaves like an open circuit, thus allowing the connection of the internal bus $1_H$ to the output buffers $3_L$. This characteristic allows to use a 16-bit memory device even if one wishes to use only a parallelism that uses 8 out of 16 possible bits.

It should be noted that in this case, too, the redundancy that relates to the part H performs its function during reading (programming is always 16 bit, and so is DMA).

In practice, it has been observed that the device according to the invention fully achieves the intended aim, since it allows to provide a data input/output managing device that assumes bidirectionality characteristics by virtue of the introduction of an internal bus, which becomes bidirectional for the transmission of data from the memory matrix to the outside and from the outside to the memory matrix for programming.

At the same time, the device according to the invention allows to manage redundancy during reading of the memory matrix, during its programming, and during DMA.

The device according to the invention also allows direct access to the memory matrix to directly read said memory matrix or the redundancy lines if direct access to a redundancy line must be performed.

Finally, the device according to the invention manages 8 bit or 16 bit parallelism of the memory matrix during reading.

In this manner, the internal bus provided to bidirectionally transmit information and data to and from the memory drastically reduces the number of lines required to perform these operations between mutually communicating structures that are arranged in mutually distant positions, conveying all the information on "single" points by means of the internal bus.

Each operation for memory access or for reading from the memory is handled in an exclusive manner, never in a parallel manner, thus ensuring maximum reliability of the transmission of the data and information related to the memory.

All the paths for access to the data bus are controlled by bidirectional structures that allow the flow of data in two directions, toward the memory and from the memory, in an exclusive manner.

The device thus conceived is susceptible of numerous modifications and variations, all of which are within the scope of the inventive concept; all the details may furthermore be replaced with other technically equivalent elements.

In practice, the materials employed, so long as they are compatible with the specific use, as well as the dimensions, may be any according to the requirements and the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A data input/output managing device for non-volatile memories that comprise at least one matrix of memory cells, the data input/output managing device comprising:
   at least one bidirectional internal bus for the transfer of data from and to said memory matrix;
   a redundancy management line that is associated with said internal bus;
   means for enabling and disabling transmission, over said internal bus, of data from the memory matrix;
   means for enabling and disabling transmission, over said internal bus, of data to the memory matrix; and
   means for enabling and disabling a connection to said redundancy line during reading of said memory matrix and during its programming.

2. The device according to claim 1, further comprising means for enabling and disabling direct memory access by means of said internal bus.

3. The device according to claim 1, further comprising means for setting a number of parallel bits of an input word to the device to either 8 or 16.

4. The device according to claim 1, wherein said bidirectional internal bus includes 16 lines for transmitting data from and to said at least one matrix of memory cells.

5. The device according to claim 4, further comprising means for forcing said redundancy line to a reference potential and means for forcing lines of said internal bus to the reference potential.

6. The device according to claim 1, wherein said means for enabling and disabling transmission, by means of said internal bus, of the data from the memory matrix comprise bidirectional components.

7. The device according to claim 1, wherein said means for enabling and disabling transmission of data to the memory matrix comprise bidirectional components.

8. The device according to claim 1, wherein said means for enabling and disabling a connection to said redundancy line during reading of said memory matrix and during its programming has an input to receive a redundancy occurrence signal.

9. The device according to claim 2, wherein said means for enabling and disabling direct access to said memory matrix include rerouting means for rerouting onto said redundancy line data read from the memory matrix and data written to the memory matrix during direct access to the memory matrix, said rerouting means having a first input to receive a signal for enabling direct access to the memory matrix and a second input to receive a redundancy occurrence signal.

10. The device according to claim 5, wherein said means for forcing said redundancy line to the reference potential include a first and a second transistor, the first transistor having an input to receive a signal for enabling the programming of said memory matrix and the second transistor having an input to receive a no-redundancy signal.

11. The device according to claim 10, wherein said means for forcing the lines of said internal bus to the reference potential has a first input to receive said signal for enabling the programming of said memory matrix and a second input to receive a redundancy occurrence signal.

12. The device according to claim 1, wherein said means for enabling and disabling transmission, over said internal bus, of data to the memory matrix includes rerouting means for rerouting onto said redundancy line data to be written to the memory matrix.

13. The device according to claim 3, wherein said means for setting a number of parallel bits of an input word to the device to either 8 or 16 have an input that receives a parallelism signal which sets the number of bits to either 8 or 16.

14. A data input/output managing apparatus for managing input data to be written to a memory and for managing output data to be read from the memory, the apparatus comprising:
   an input/output port that receives data to be written to the memory and provides data read from the memory;
   a data bus that receives data read from the memory and transmits data to the memory, the data bus having a node to receive data and to provide data;
   a first data path to transmit data read from the memory between the data bus and the input/output port;
   a second data path to transmit data to be written to the memory between the input/output port and the data bus; and
   a first switch, coupled to the second data path, that selectively couples the second data path between the node of the data bus and the input/output port.

15. The data input/output managing apparatus of claim 14, further comprising:
   a redundancy data line; and
   a second switch arranged to selectively couple the redundancy data line to one of the first and second data paths.

16. The data input/output managing apparatus of claim 15, further comprising:
   a third data path to transmit read data from the data bus to the input/output port and to transmit write data from the input/output port to the data bus; and
   a third switch, coupled to the third data path, that selectively couples the third data path between the input/output port and the node of the data bus.

17. The data input/output managing apparatus of claim 16, further comprising an input to receive a word length signal, and wherein the first, second and third data paths are parallel data paths having a width equal to a number of bits, and wherein the width of each of the first, second and third data paths is set by the apparatus in response to the word length signal.

18. The data input/output managing apparatus of claim 17, in combination with the memory.

19. The data input/output managing apparatus of claim 14, further comprising:
   a third data path to transmit read data from the data bus to the input/output port and to transmit write data from the input/output port to the data bus; and
   a third switch, coupled to the third data path, that selectively couples the third data path between the input/output port and the node of the data bus.

20. The data input/output managing apparatus of claim 14, further comprising an input to receive a word length signal, and wherein the first and second data paths are parallel data paths having a width equal to a number of bits, and wherein the width of each of the first and second data paths is set by the apparatus in response to the word length signal.

21. The data input/output managing apparatus of claim 14, in combination with the memory.

22. The data input/output managing apparatus of claim 14, further comprising means for selectively coupling the first data path between the node of the data bus and the input/output port.

23. A method for managing input data to be written to a memory and for managing output data to be read from the memory, the method comprising steps of:

establishing a first data path between the memory and an input/output port for transmitting data read from the memory to the input/output port;

establishing a second data path between the memory and the input/output port for transmitting data to be written to the memory; and enabling a selected one of the first data path and the second data path and disabling the other of the first data path and the second data path.

24. The method of claim 22, further comprising the step of:

selectively coupling at least part of one of the first and second data paths to a redundancy line such that data to be read from memory is transferred from the redundancy line to the one of the first and second data paths and such that data to be written to memory is transferred from the one of the first and second data paths to the redundancy line.

25. The method of claim 24, further comprising steps of:
establishing a third data path between the memory and the input/output port; and
disabling the first and second data paths and enabling the third data path.

26. The method of claim 25, wherein each of the first, second and third data paths are parallel data paths having a width equal to a number of bits, the method further comprising a steps of:
receiving a control signal; and
setting the width of the first, second and third data paths based on a state of the control signal.

27. The method of claim 22, further comprising steps of:
establishing a third data path between the memory and the input/output port; and
disabling the first and second data paths and enabling the third data path.

28. The method of claim 22, wherein each of the first and second data paths are parallel data paths having a width equal to a number of bits, the method further comprising steps of:
receiving a control signal; and
setting the width of the first and second data paths based on a state of the control signal.

29. A data input/output managing apparatus for managing input data to be written to a memory and for managing output data to be read from the memory, the apparatus comprising:

an input/output port that receives data to be written to the memory and provides data read from the memory;

a data bus that receives data read from the memory and transmits data to the memory, the data bus having a node to receive data and to provide data;

a first data path to transmit data read from the memory between the data bus and the input/output port;

a second data path to transmit data to be written to the memory between the input/output port and the data bus;

means for coupling the first data path between the input/output port and the node of the data bus to establish a first mode of operation of the data input/output managing device; and means for coupling the second data path between the input/output port and the node of the data bus to establish a second mode of operation of the data input/output managing device.

30. The data input/output managing apparatus of claim 29, wherein the means for coupling the first data path includes means for disabling the second data path, and wherein the means for coupling the second data path includes means for disabling the first data path.

31. The data input/output managing apparatus of claim 30, further comprising:

a redundancy data line; and means for coupling the redundancy data line to one of the first and second data paths to establish a third mode of operation of the data input/output managing device.

32. The data input/output managing apparatus of claim 31, further comprising:

a third data path to transmit read data from the data bus to the input/output port and to transmit write data from the input/output port to the data bus; and means for coupling the third data path between the node and the input/output port to establish a fourth mode of operation of the data input/output apparatus.

33. The data input/output managing apparatus of claim 32, wherein the means for coupling the third data path includes means for disabling the first and second data paths.

34. The data input/output managing apparatus of claim 32, wherein the first, second and third data paths are parallel data paths having a width equal to a number of bits, the data input/output apparatus further comprising means for setting the width of each of the first, second and third data paths.

35. The data input/output managing apparatus of claim 29, further comprising:

a third data path to transmit read data from the data bus to the input/output port and to transmit write data from the input/output port to the data bus; and means for coupling the third data path between the node and the input/output port to establish a fourth mode of operation of the data input/output apparatus.

36. The data input/output managing apparatus of claim 29, wherein the first and second data paths are parallel data paths having a width equal to a number of bits, the data input/output apparatus further comprising means for setting the width of each of the first and second data paths.

* * * * *

UNITED STATES PATENT AND TRADEMARK OFFICE
CERTIFICATE OF CORRECTION

PATENT NO.    : 5,815,437
DATED         : September 29, 1998
INVENTOR(S)   : Luigi Pascucci et al.

It is certified that error appears in the above-identified patent and that said Letters Patent is hereby corrected as shown below:

<u>Column 11,</u>
Line 26, should read -- 24. The method of claim 23, further comprising the step --.
Line 47, should read -- 27. The method of claim 23, further comprising steps of: --.
Line 52, should read -- 28. The method of claim 23, wherein each of the first and --.

Signed and Sealed this

Ninth Day of May, 2006

JON W. DUDAS
*Director of the United States Patent and Trademark Office*